US 8,017,303 B2

(12) United States Patent
Goldfarb et al.

(10) Patent No.: US 8,017,303 B2
(45) Date of Patent: Sep. 13, 2011

(54) ULTRA LOW POST EXPOSURE BAKE PHOTORESIST MATERIALS

(75) Inventors: Dario Leonardo Goldfarb, Dobbs Ferry, NY (US); Mahmoud Khojasteh, Poughkeepsie, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 12/390,764

(22) Filed: Feb. 23, 2009

(65) Prior Publication Data
US 2010/0216071 A1 Aug. 26, 2010

(51) Int. Cl.
G03F 7/00 (2006.01)
G03F 7/004 (2006.01)
C08J 3/28 (2006.01)

(52) U.S. Cl. ............ 430/270.1; 430/913; 430/945; 522/154; 522/156

(58) Field of Classification Search .......... 430/270.1, 430/945, 913; 522/154, 156
See application file for complete search history.

(56) References Cited

U.S. PATENT DOCUMENTS

| | | | |
|---|---|---|---|
| 5,712,078 A | 1/1998 | Huang et al. | |
| 6,270,938 B1 | 8/2001 | Gandini et al. | |
| 6,610,456 B2 * | 8/2003 | Allen et al. | 430/270.1 |
| 6,743,565 B2 * | 6/2004 | Mizutani et al. | 430/270.1 |
| 7,193,023 B2 | 3/2007 | Allen et al. | |
| 7,217,496 B2 * | 5/2007 | Khojasteh et al. | 430/270.1 |
| 7,304,190 B2 | 12/2007 | Liu et al. | |
| 7,449,277 B2 * | 11/2008 | Hatakeyama et al. | 430/270.1 |
| 7,491,483 B2 * | 2/2009 | Hatakeyama et al. | 430/270.1 |
| 7,569,326 B2 * | 8/2009 | Ohsawa et al. | 430/270.1 |
| 7,592,125 B2 * | 9/2009 | Suzuki et al. | 430/270.1 |
| 7,771,914 B2 * | 8/2010 | Hatakeyama et al. | 430/270.1 |
| 7,781,144 B2 * | 8/2010 | Kinoshita et al. | 430/270.1 |
| 2007/0231738 A1 | 10/2007 | Kaneko et al. | |
| 2007/0275321 A1 | 11/2007 | LaFontaine et al. | |
| 2007/0275328 A1 | 11/2007 | Shiono et al. | |
| 2008/0096134 A1 * | 4/2008 | Sugimoto et al. | 430/287.1 |
| 2009/0068342 A1 * | 3/2009 | Senzaki et al. | 427/58 |
| 2009/0135719 A1 * | 5/2009 | Gautier et al. | 370/230 |
| 2009/0170029 A1 * | 7/2009 | Choi et al. | 430/285.1 |
| 2009/0226851 A1 * | 9/2009 | Ootake et al. | 430/326 |
| 2010/0022730 A1 * | 1/2010 | Hatakeyama et al. | 526/246 |

FOREIGN PATENT DOCUMENTS

| | | | | |
|---|---|---|---|---|
| JP | 11030864 A | * | 2/1999 | |
| JP | 2003122007 A | * | 4/2003 | |
| JP | 2003344994 A | * | 12/2003 | |
| JP | 2004122007 A | * | 4/2004 | |
| JP | 2006335932 A | * | 12/2006 | |
| WO | WO 2009104726 A1 | * | 8/2009 | |

OTHER PUBLICATIONS

Machine translation of JP 2006-335932A (no date).*

* cited by examiner

Primary Examiner — Amanda C. Walke
(74) Attorney, Agent, or Firm — Schmeiser, Olsen & Watts; Ian D. MacKinnon

(57) ABSTRACT

Polymers comprising a first methacrylate monomer having a pendent spacer between the polymer backbone and an acid-liable acetal group, a second methacrylate monomer having a pendent group including a fluorinated alkyl group and a third methacrylate monomer having a pendent hydrocarbon group. Photoresist formulations include the polymers, a photoacid generator and a casting solvent. Methods of patterning photoresist films formed from the photoresist formulations are characterized by post-exposure bakes at temperatures of about 60° C. or less.

32 Claims, 4 Drawing Sheets

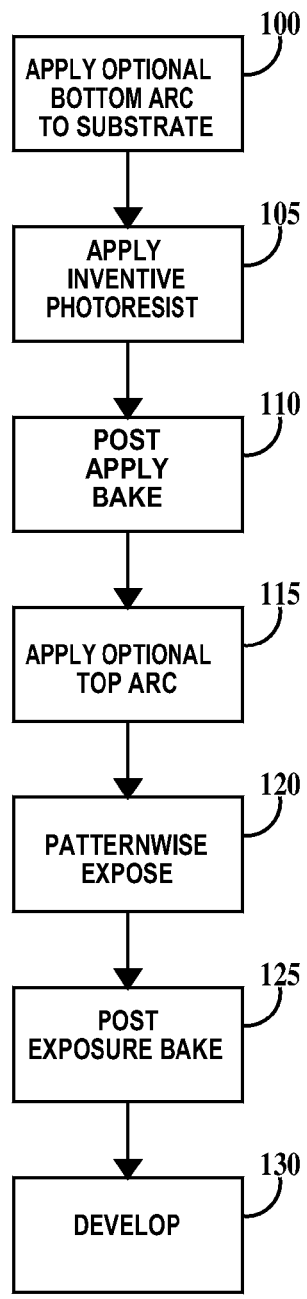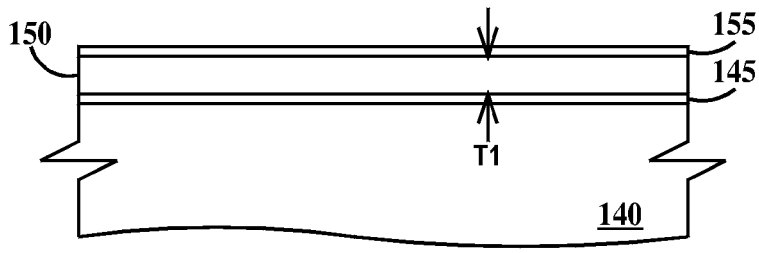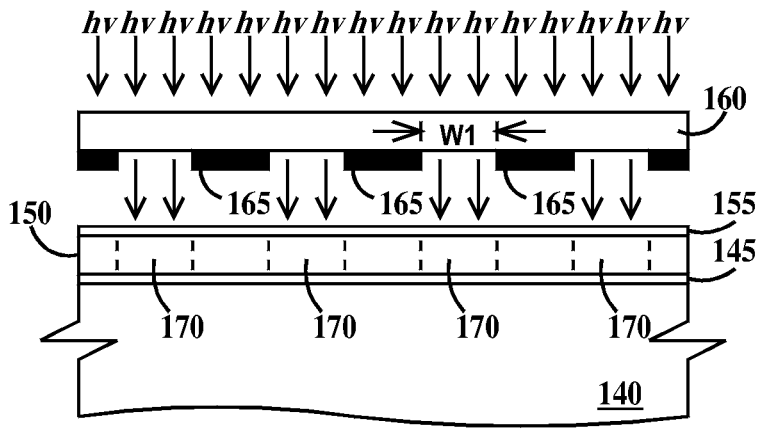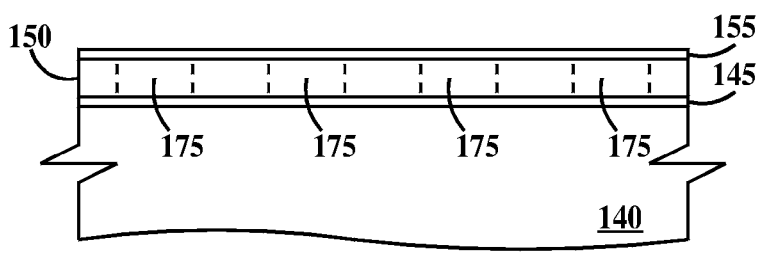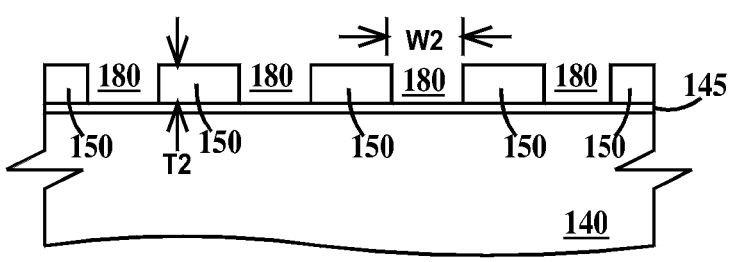
FIG. 1
FIG. 2A
FIG. 2B
FIG. 2C
FIG. 2D

ULTRA LOW POST EXPOSURE BAKE PHOTORESIST MATERIALS

FIELD OF THE INVENTION

The present invention relates to the field of photolithography. More specifically, the invention relates to photoresist polymers containing an acetal linkage and their use in lithographic photoresist compositions, particularly in chemically amplified photoresists.

BACKGROUND OF THE INVENTION

Chemically amplified photoresists have replaced chain-scission photoresists due to improved photo-speed at 248 nm and shorter wavelengths, while providing acceptable spatial resolution for images in the sub-quarter micron regime. However, acceptable spatial resolution at sub-100 nm dimensions for advanced patterning nodes requires improved chemically amplified photoresist materials and compositions. Poor photolithographic image resolution limits the scaling of devices of integrated circuits.

SUMMARY OF THE INVENTION

A first aspect of the present invention is a polymer comprising:
a first monomer of the structure

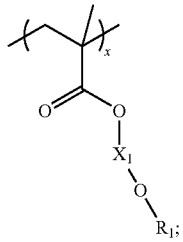

a second monomer of the structure

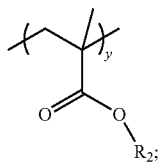

a third monomer of the structure

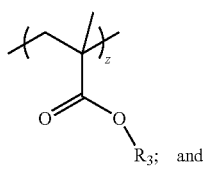

wherein $X_1$ is an ester group, an ester chain or a naphthalene group, $R_1$ is an acetal group, $R_2$ includes a fluorinated alkyl group and $R_3$ is an alkyl group, cyclic group, hereto cyclic group, bicyclic group or hetero bicyclic group and wherein x+y+z is equal to about 100 mole %.

A second aspect of the present invention is the first aspect wherein, wherein, $X_1$, $R_1$ and $R_3$ do not contain fluorine atoms.

A third aspect of the present invention is the first aspect wherein $X_1$ is selected from the group consisting of —$CH_2CH_2CO$—, —$CH_2CH_2COOCH_2CH_2CO$—, and

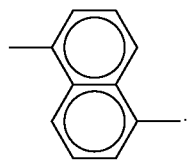

A fourth aspect of the present invention is the first aspect wherein $R_1$ is selected from the group consisting of

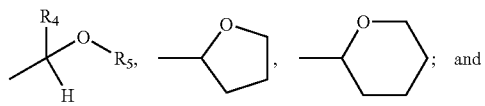

wherein $R_4$ and $R_5$ are independently selected from the group consisting of hydrogen, methyl, ethyl, n-propyl, iso-propyl, n-butyl, isobutyl and t-butyl groups and saturated cyclic ethers.

A fifth aspect of the present invention is the first aspect wherein $R_2$ is selected from the group consisting of linear alkyl fluoroalcohols, branched alkyl fluoroalcohols, cycloalkanes having pendent alkyl fluoroalcohol groups and bicycloalkanes having pendent alkyl fluoroalcohol groups.

A sixth aspect of the present invention is the first aspect wherein $R_3$ is selected from the group consisting of straight and branched chain alkyl groups and bicycloalkyl and heterobicycloalkyl groups.

A seventh aspect of the present invention is the first aspect wherein the first monomer is selected from the group consisting of:

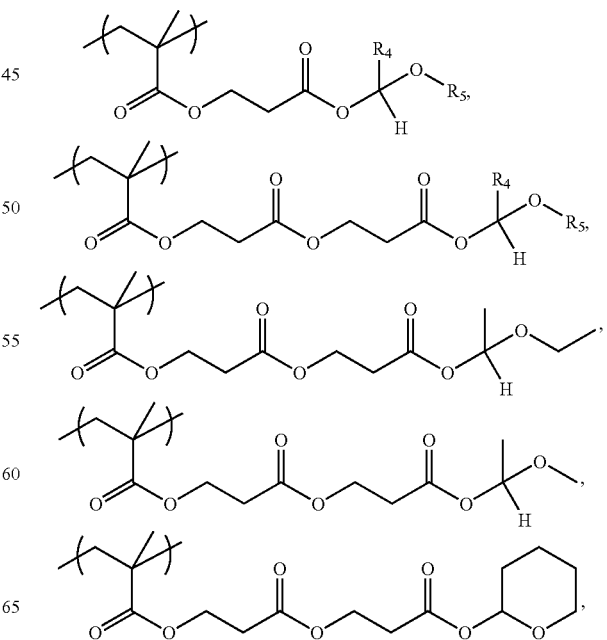

3

-continued

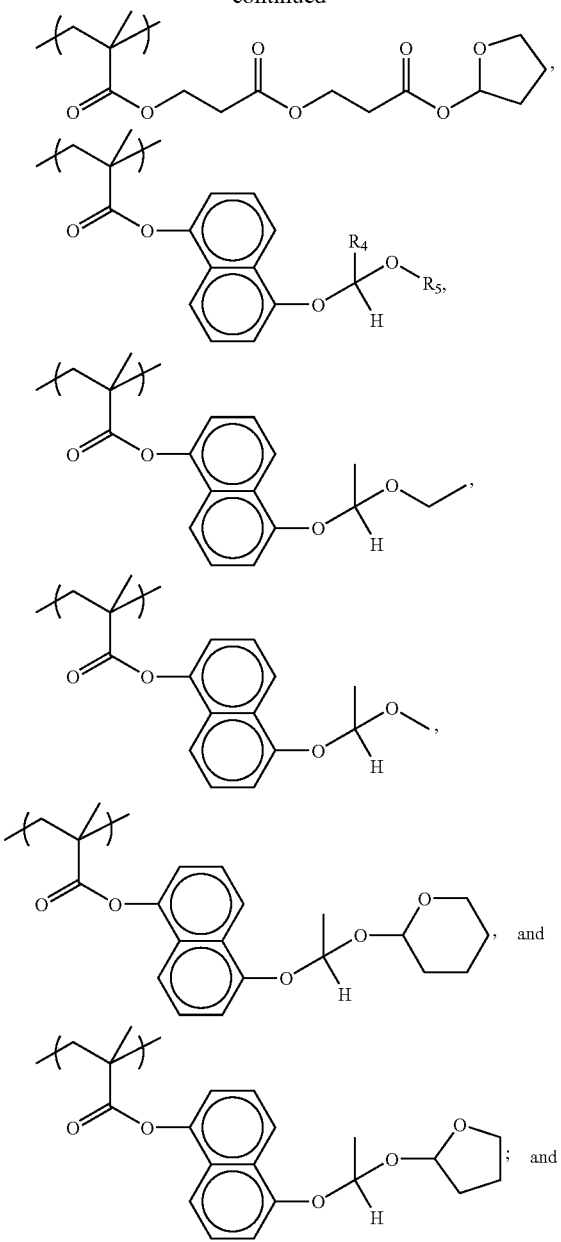

wherein R₄ and R₅ are independently selected from the group consisting of hydrogen, methyl, ethyl, n-propyl, isopropyl, n-butyl, isobutyl and t-butyl groups and saturated cyclic ethers.

An eighth aspect of the present invention is the first aspect, wherein the second monomer is selected from the group consisting of:

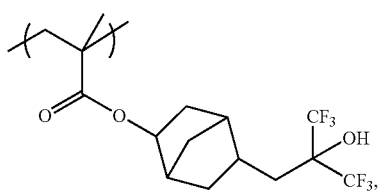

4

-continued

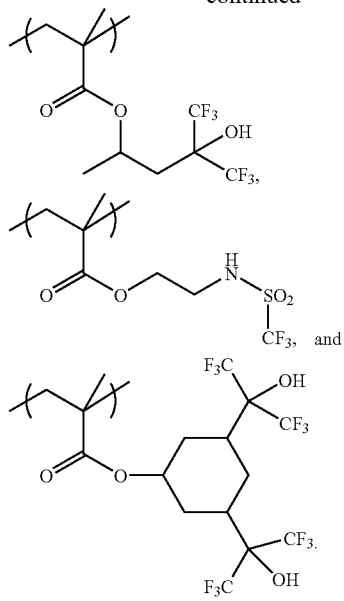

A ninth aspect of the present invention is the first aspect wherein the third monomer is selected from the group consisting of:

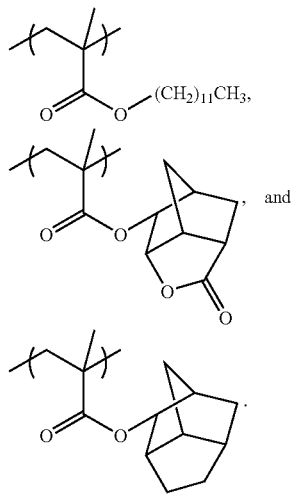

These and other aspects of the invention are described in further detail below:

BRIEF DESCRIPTION OF THE DRAWINGS

FIG. 1 a flowchart of an exemplary photolithographic process in which photoresist materials and compositions according to embodiments of the present invention may be used;

FIGS. 2A-2D are cross-sections illustrating an exemplary photolithographic process in which photoresist materials and compositions according to embodiments of the present invention may be used;

DETAILED DESCRIPTION OF THE INVENTION

Figure 3:
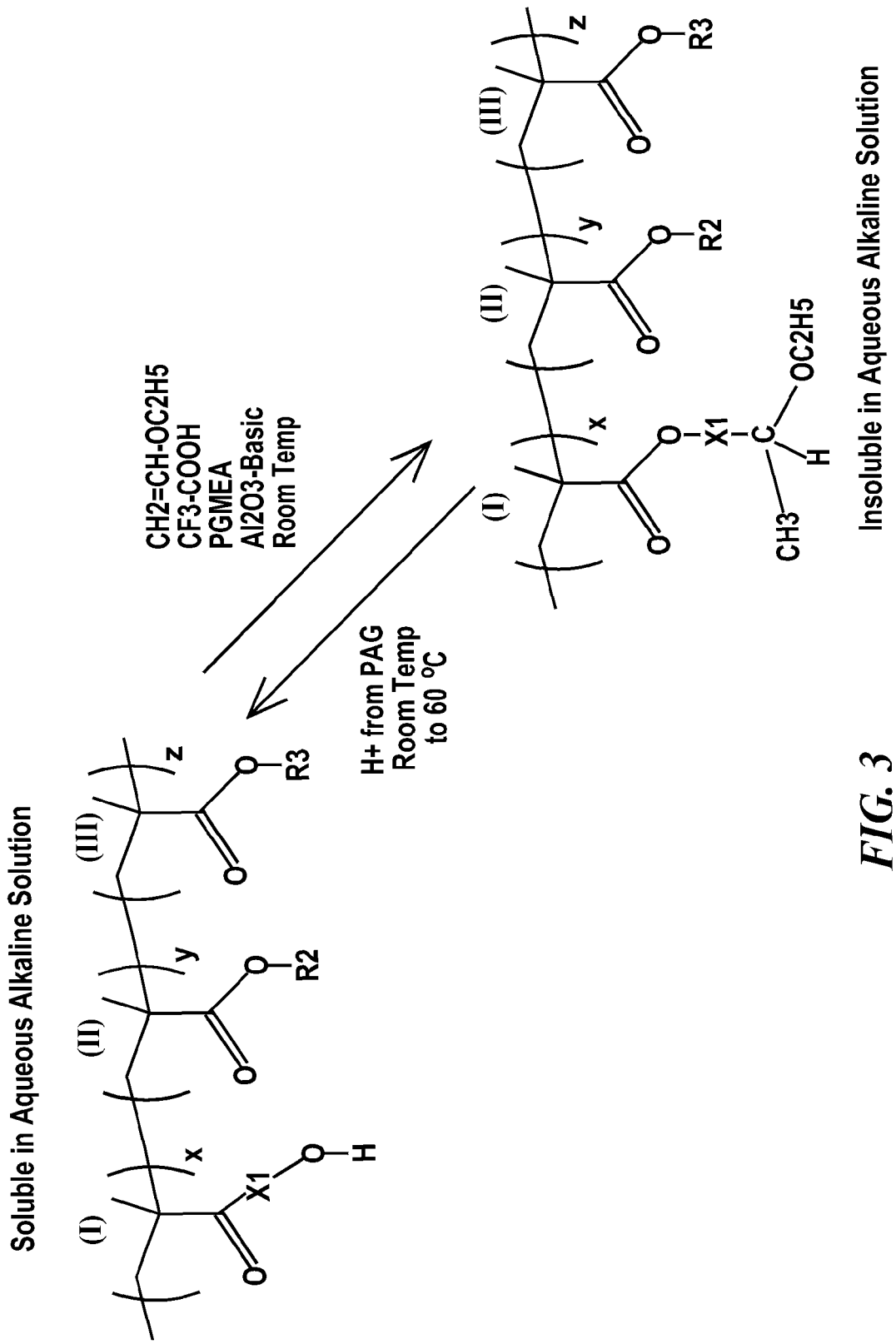
FIG. 3 illustrates the chemical principles of a chemically amplified photoresist polymer according to the embodiments of the present invention.

The singular forms "a" and "an" are intended to encompass plural referents, unless the context clearly dictates otherwise.

An alkyl group is defined as a liner or branched, saturated hydrocarbon substituent that generally, although not necessarily, contains 1 to about 24 carbon atoms, such as methyl, ethyl, n-propyl, isopropyl, n-butyl, isobutyl, t-butyl, octyl, decyl, dodecyl, tetradecyl, hexadecyl, eicosyl, tetracosyl and the like.

An acetal group is defined as a carbon atom (the acetal carbon atom) connected to two oxygen atoms by single bonds. In one example an acetal group has the general formula —$R_a$—CH ($OR_b$)($OR_c$). Other examples of acetal groups are acetal cyclic ethers where the acetal carbon atom is an atom in the ring bonded to a first oxygen atom in the ring and a second oxygen atom outside the ring.

An ester group is defined as including carbon atom connected to a first oxygen atom by a single bond and to a second oxygen atom and having the general formula —$R_d$—CO—$OR_e$. An ester chain includes two or more linked esters as in the formula —$R_f$—CO—$OR_g$—CO—$OR_h$—. The —$OR_e$ and —$OR_h$, may be acetal groups.

The term "fluorinated" refers to replacement of a hydrogen atom in a molecule or molecular segment with a fluorine atom.

A fluoroalcohol is defined as an organic compound bearing a hydroxyl group wherein one or more non-hydroxyl group hydrogen atoms are replaced with fluorine atoms. The fluoroalcohol may be comprised of a linear, branched, cyclic, polycyclic, or aromatic structure.

The term hetero refers to a nitrogen, sulfur or oxygen atom replacing a carbon atom in an alkyl, cycloalkyl or bicycloalkyl group.

The term "acid-cleavable" refers to a molecular segment containing at least one covalent bond that is cleaved upon exposure to acid.

The term soluble is defined in its ordinary and sense, in that the solute will dissolve completely in the solvent after a predetermined amount of time has elapsed. The term insoluble is defined in its ordinary sense in that virtually none of the solute will dissolve in the solvent after the predetermined amount of time has elapsed. A solute where only trace amounts dissolve in the solvent after the predetermined amount of time has elapsed is considered insoluble.

The terms "photo-generated acid" and "photoacid" are used interchangeably to refer to an acid that is created by exposing a photoacid generator (PAG) to actinic radiation. An example of actinic radiation in the context of the embodiments of the present invention is ultraviolet light having a wavelength of 193 nm.

Mole % is the number of moles of each repeat unit (monomer type) in one mole of polymer. One mole of polymer is 100% mole percent. For example, if a mole of a first repeat unit weighs 10 grams, a mole of a second repeat unit weighs 20 grams and a mole of a third repeat unit weighs 20 grams, a mole of polymer comprising about 33% mole percent of each of the three repeat units would weigh about 50 grams. If a polymer was synthesized using 20 grams of each of the three repeat units, the mole % of the first repeat unit would be about 50%, the mole % of the second repeat unit would be about 25%, and the mole % of the third repeat unit would be about 25%.

FIG. 1 a flowchart of an exemplary photolithographic process in which photoresist materials and compositions according to embodiments of the present invention may be used. In step 100, an optional bottom antireflective coating (BARC) is formed on a substrate. On one example, the BARC is formed by spin application. In spin application, a puddle of a liquid material is formed in the center of the substrate and then the substrate rotated about its center to form a thin uniform coating of the material applied. Alternatively, the material may be applied while the substrate is rotating. In step 105, a photoresist formulation is applied to the substrate to form a photoresist layer. In one example, the photoresist layer is formed by spin application of the photoresist composition. In step 110, the photoresist layer is baked in a post apply bake (PAB) before exposure to drive out the casting solvent of the photoresist composition and to form a photoresist film. In one example the PAB is greater than room temperature. In one example, the PAB is performed at a temperature between about 60° C. and about 100° C. In step 115, an optional top-antireflective coating (TARC) is formed over the photoresist film. In one example, the TARC is formed by spin application.

Photoresist formulations according to the embodiments of the present invention include a polymer comprising a first methacrylate monomer having a pendent spacer between the polymer backbone and an acid-liable acetal group, a second methacrylate monomer having a pendent group including a fluorinated alkyl group and a third methacrylate monomer having a pendent hydrocarbon group. Photoresist formulations according to the embodiments of the present invention include a PAG, a casting solvent and an optional quencher to control the lateral diffusion of photo-generated acid during post exposure bake (described infra).

Returning to FIG. 1, in step 120 a patternwise exposure of the photoresist film is to actinic radiation is performed. The exposure causes the PAG in the exposed regions of the photoresist film to release photoacid. The photoacid cleaves acid liable groups of the photoresist polymer, making the polymer soluble in developer (e.g., aqueous alkaline solution), whereas before the cleaving the polymer was not soluble in aqueous alkaline solution. In step 125 a post exposure bake (PEB) is performed at a temperature between room temperature and about 60° C. While actinic radiation provides the energy to generate photoacid from the PAG, the PEB supplies energy to activate the cleavage of the acid-liable group from the polymer by the photoacid.

Room temperature is defined as a temperature between about 18° C. and about 24° C. A room temperature bake is defined as a bake performed at between about 18° C. and about 24° C. or as the absence of a baking step (i.e., not baking) between exposure of the photoresist layer and development of the photoresist layer. It is possible to perform a room temperature bake at a temperature different from the ambient temperature of the fabricating facility. In a facility having an ambient temperature of about 18° C., a PEB at 20° C. would be still be considered a room temperature PEB.

It is a critical feature of the present invention that the photoresist compositions of the present invention utilizing the polymers of the present invention be capable of producing an acceptable image contrast between exposed and non-exposed regions after development having had a PEB of about room temperature or having had a PEB of no greater than 60° C. Current art chemically amplified photoresist compositions require PEBs of between 90° C. and 135° C. in order to generate enough photoacid to cleave enough acid-liable groups of the photoresist polymer to produce acceptable image contrast between exposed and non-exposed regions after development. At PEB temperatures of greater than about 60° C., diffusion of the photoacid from exposed regions to unexposed regions of the photoresist layer results in poor (high) image size tolerance. Thus by lowering the PEB temperature without significantly reducing the contrast between exposed and non-exposed photoresist regions, image size tolerance is improved.

Acceptable image contrast is defined as complete removal of photoresist polymer in exposed regions of the photoresist layer with less than about 50% loss of photoresist thickness after development compared to a thickness of the unexposed region after PAB and before development.

Returning to FIG. 1, in step 130 the exposed photoresist film is developed in aqueous alkaline solution, which in a positive resist removes exposed regions of the photoresist film and develops a pattern of photoresist islands and/or trenches in a the photoresist layer.

FIGS. 2A-2D are cross-sections illustrating an exemplary photolithographic process in which photoresist materials and compositions according to embodiments of the present invention may be used. In FIG. 2A, formed on a substrate 140 is BARC 145, formed on BARC 145 is a photoresist film 150, and formed on photoresist film 150 is an optional TARC 155 as described supra in reference to steps 100, 105, 110 and 115 of FIG. 1. By way of example, the thickness of photoresist film 150 is T1.

In FIG. 2B, photoresist film 150 is exposed to actinic radiation hv through a photomask comprising a transparent substrate 160 and opaque regions (to actinic radiation hv) as described supra in reference to step 120 of FIG. 1. Photoacid is generated in regions 170 of photoresist film 150 that were not protected from radiation hv by opaque regions 165. By way of example, the space between opaque regions 165 is W1.

In FIG. 2C, after a room temperature PEB or a PEB of less about 60° C. or less as described supra in reference to step 125 of FIG. 1, a latent image 175 is formed in photoresist film 150. For a chemically amplified positive photoresist, regions 175 a soluble in aqueous alkaline developer while photoresist layer is either not or significantly less soluble than regions 175.

In FIG. 2D, after developing in aqueous alkaline developer as described supra in reference to step 130 of FIG. 1, openings 180 are formed in photoresist film 150, exposing either BARC 145, if present, or substrate 140 in the bottom of openings 180. TARC 155 (see FIG. 2C) has been removed by the development process. By way of example, the width of opening 180 is W2 and the thickness of photoresist film 150 is T2.

Ideally W1 and W2 are equal and T1 and T2 are equal. The ratio W2/W1 is a measure of image size tolerance. In practice W2 is greater than W1 for several reasons, including gradient driven diffusion of photoacid from exposed regions of the photoresist layer to unexposed regions of the photoresist layer and swelling of partially de-protected (i.e., wherein some but not all of the acid liable groups have been cleaved) polymer molecules. Photoacid diffusion is dependent upon the chemical functionality of the photoresist polymer, PEB temperature and PEB time. Thus reducing the PEB temperature will decrease W2 and decrease (improve) the image size tolerance. Swelling has been found to be reduced by selection of the type and length of the pendent group to which the acid-liable group is attached. For example, a polymer according to the embodiments of the present invention having a monomer with a —COO—(CH2)n-COO—CH(CH3)-O—C2H5 pendent group when converted by de-protection to —COO—(CH2)n-COO—CH(CH3)-swelled while a polymers according to the embodiments of the present invention having a monomer with a —COO—CH2CH2—COO—CH2CH2OCOO—CH(CH3)-O—C2H5 pendent group when converted by de-deprotection to —COO—CH2CH2—COO—CH2CH2OCOOH did not swell. This unexpected result appears due to the fact the non-swelling polymer had a monomer with a pendent ester chain as a spacer between the backbone and the acid-liable group while the polymer that swelled had a monomer with a pendent hydrocarbon chain group as the spacer between the backbone and the acid-liable group. Except for the pendent groups, the two polymers were the same. Additionally it appears ester based spacers have a low de-protection activation energy (Ea). A low Ea means a lower PEB temperature may be used, reducing photoacid diffusion.

Photoresist polymers according to embodiments of the present invention comprise of methacrylate monomers of the structures:

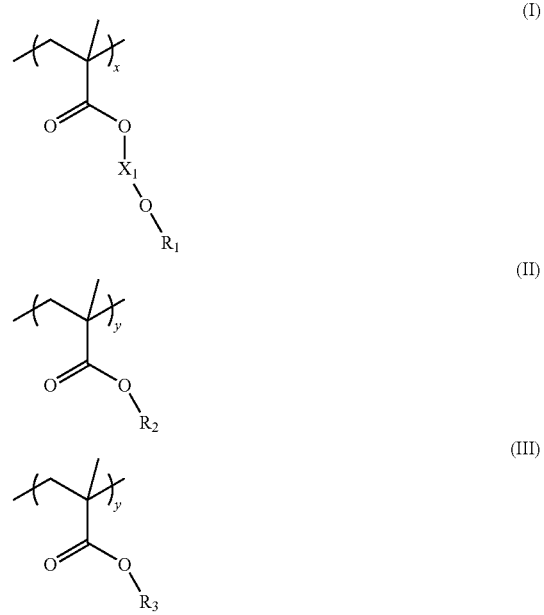

where $X_1$ is an ester group, an ester chain or a naphthalene group, $R_1$ is an acetal group, $R_2$ includes a fluorinated alkyl group and $R_3$ is an alkyl group, cyclic group, hereto cyclic group, bicyclic group or hetero bicyclic group and where x is between about 30 mole % and about 55 mole %, y is between about 5 mole % and about 30 mole %, z is between about 30 mole % and about 50 mole %, wherein x+y+z is equal to about 100 mole %.

In one example, $X_1$, $R_1$ and $R_3$ do not contain fluorine atoms.

In one example, $X_1$ is selected from the group consisting of —$CH_2CH_2CO$—, —$CH_2CH_2COOCH_2CH_2CO$—, and

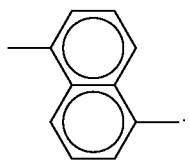

In one example, $R_1$ is selected from the group consisting of

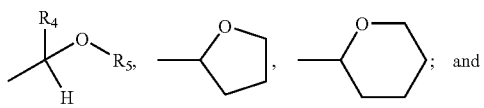

$R_4$ and $R_5$ are independently selected from the group consisting of hydrogen, methyl, ethyl, n-propyl, isopropyl, n-butyl, isobutyl and t-butyl groups and saturated cyclic ethers.

In one example, $R_2$ is selected from the group consisting of linear alkyl fluoroalcohols, branched alkyl fluoroalcohols, cycloalkanes having pendent alkyl fluoroalcohol groups and bicycloalkanes having pendent alkyl fluoroalcohol groups.

In one example, $R_3$ is selected from the group consisting of straight and branched chain alkyl groups and bicycloalkyl and hetero-bicycloalkyl groups.

In one example, polymers according to the embodiments of the present invention consist essentially of terpolymers having one monomer selected from each of the three groups I, II and III described supra. In one example, polymers according to the embodiments of the present invention consist essentially of polymers having one monomer selected from each of the three groups I, II and III and one or more additional and different monomers selected from at least one of the three groups I, II and III. In one example, polymers according to the embodiments of the present invention comprise one monomer selected from each of the three groups I, II and III and one or more additional monomers.

In one example, monomer (I) is selected from the group consisting of:

(IV)
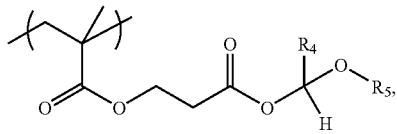

(V)
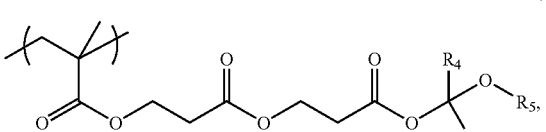

(VI)
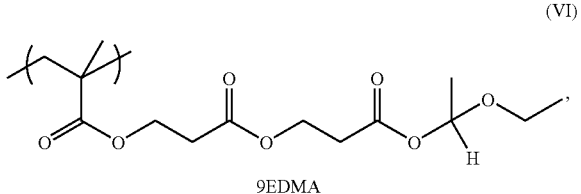

9EDMA (VII)
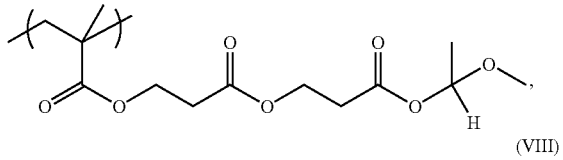

(VIII)
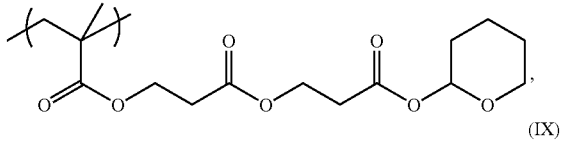

(IX)
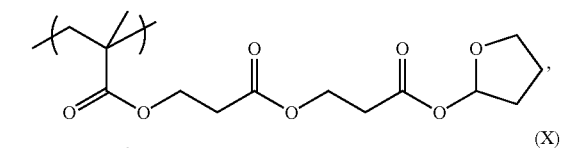

(X)
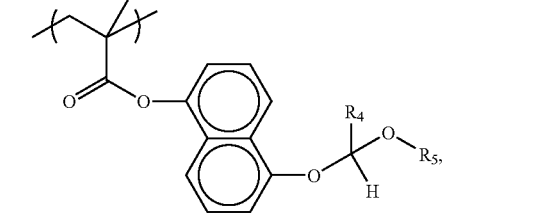

(XI)
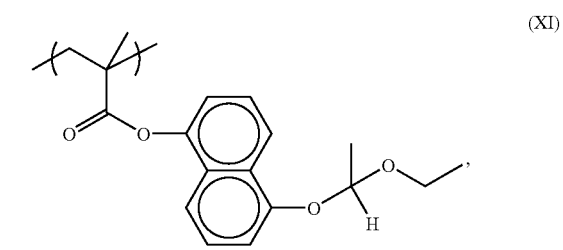

(XII)
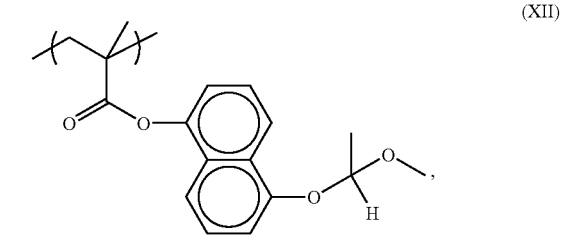

(XIII)
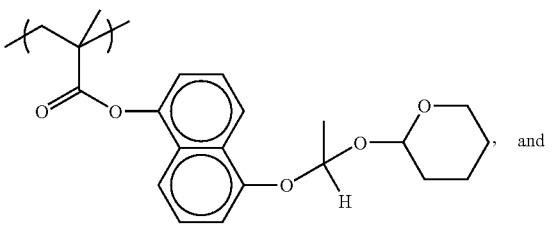

and

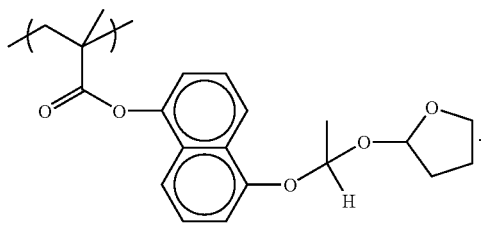
(XIV)

In one example, monomer (II) is selected from the group consisting of:

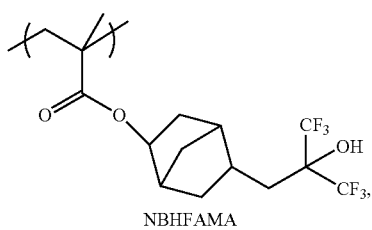
NBHFAMA (XV)

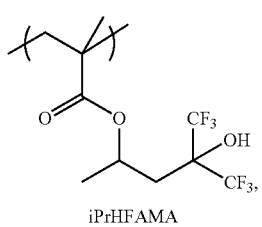
iPrHFAMA (XVI)

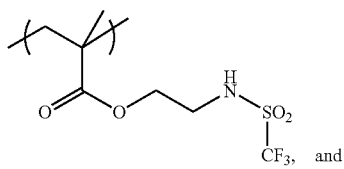
(XVII)

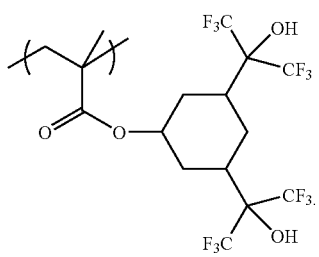
(XVIII)

In one example, monomer (III) is selected from the group consisting of

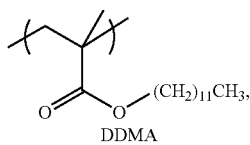
DDMA (XIX)

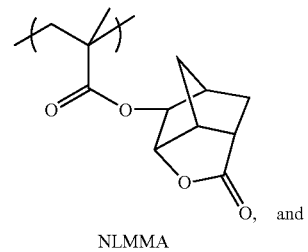
NLMMA (XX)

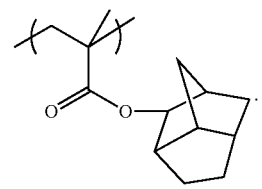
(XXI)

A first preferred polymer consists essentially of:

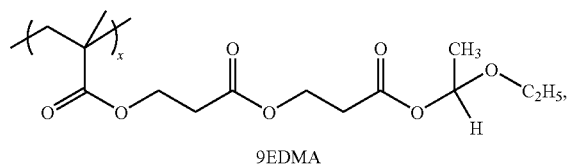
9EDMA (V)

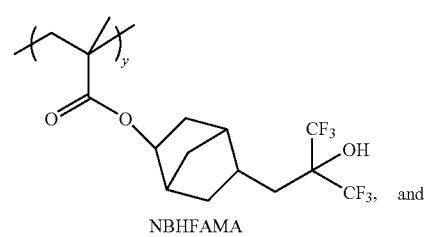
NBHFAMA (XVI)

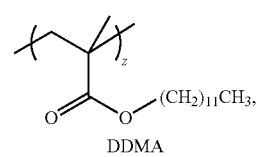
DDMA (XX)

wherein x:y:z=30-50 mole %: 10-30 mole %: 30-50 mole % and x+y+z does not exceed 100 mole %; as exemplified by:
Polymer 1 x=40 mole %, y=20 mole %, z=40 mole %.

A second preferred polymer consists essentially of:

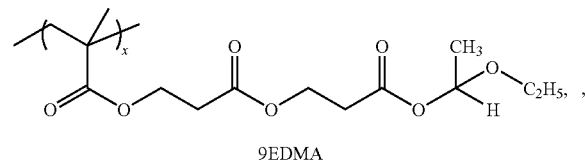
9EDMA (VI)

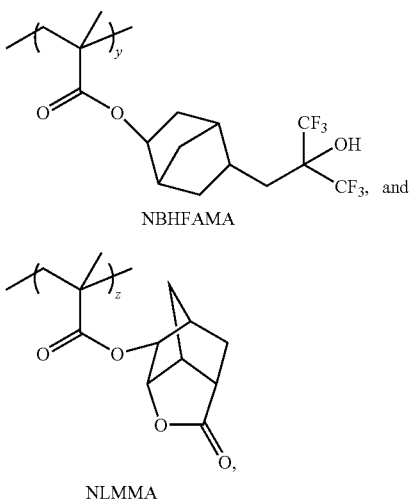

NBHFAMA (XVI)

NLMMA (XXI)

wherein x:y:z=35-55 mole %: 5-25 mole %: 30-50 mole % and x+y+z does not exceed 100 mole %; as exemplified by: Polymer 2 x=45 mole %, y=15 mole %, z=40 mole %.

A third preferred polymer consists essentially of:

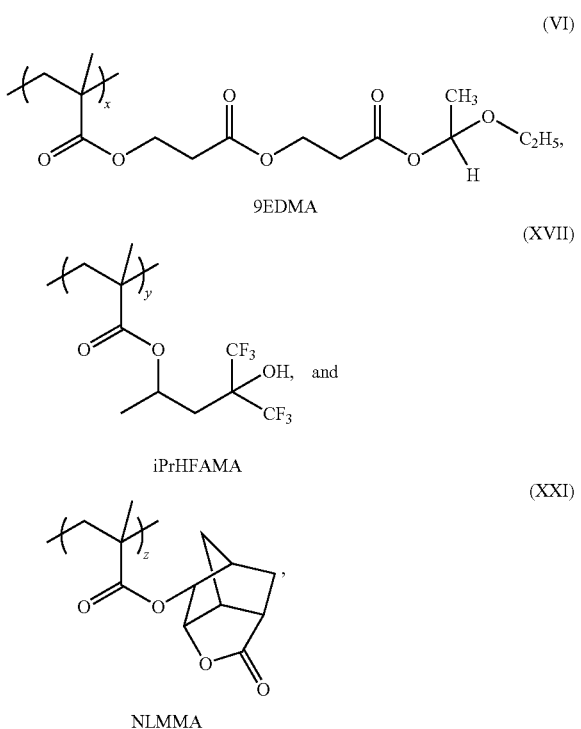

9EDMA (VI)

iPrHFAMA (XVII)

NLMMA (XXI)

wherein x:y:z=35-55 mole %: 5-25 mole %: 30-50 mole % and x+y+z does not exceed 100 mole %; as exemplified by: Polymer 3 x=45 mole %, y=15 mole %, z=40 mole %.

FIG. 3 illustrates the chemical principles of a chemically amplified photoresist polymer according to the embodiments of the present invention. In FIG. 3, a methacrylate polymer having monomers (I) in the acid form is prepared. Reacting with ethylvinylether in the presence of triflouroacetic acid in proplylene glycol methyl ether acetate (PGMEA) and subsequent treatment with basic $Al_2O_3$ converts the monomers (I) to the corresponding acetal form to produce a photoresist polymer, which is insoluble in aqueous alkaline solution (developer) according to the embodiments of the present invention. In the presence of acid from a PAG such as triphenyl sulfonium nonaflate, at a temperature between room temperature (e.g., about 20° C.) and 60° C., the acetal group is cleaved and the monomers (I) converted back to the carboxylic acid form, which is soluble in aqueous alkaline solution (developer).

Photoresist formulations according to the embodiments of the present invention include a polymer according to the embodiments of the present invention, a PAG and a casting solvent. The polymer in the photoresist formulation can represent up to about 99 percent by weight of the solids included in the formulation, and the photoacid generator can represent between about 0.1 percent by weight and about 25 percent by weight of the solids contained in the photoresist formulation.

Any suitable photoacid generator can be used in the photoresist formulations of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α, α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl) diazomethane;

(4) trifluoromethanesulfonate esters of imides and hydroxyimides, e.g., α-(trifluoromethylsulfonyloxy)-bicyclo [2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189, 323; and

(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods provided herein will be known to those skilled in the art and/or are described in the pertinent literature.

Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. In one embodiment, solvents include ethyl lactate, propylene glycol methyl ether acetate, ethyl 3-ethoxypropionate and their mixtures. The above list of casting solvents is for illustrative purposes only and should not be viewed as being comprehensive nor should the choice of solvent be viewed as limiting the invention in any way. Those skilled in the art will recognize that any number of solvents or solvent mixtures may be used as casting solvents.

In one example, greater than about 50 percent of the total weight of the photoresist formulation comprises casting solvent. In one example, greater than about 80 percent of the total weight of the photoresist formulation comprises casting solvent.

Photoresist formulations of the embodiments of the present invention may include one or more additives, such as dyes, sensitizers, additives used as stabilizers, dissolution modifying agents or dissolution inhibitors, and acid-diffusion controlling agents (quenchers), basic compounds, coating aids such as surfactants or anti-foaming agents, crosslinking agents, photo speed control agents, adhesion promoters and plasticizers.

EXAMPLES

Synthesis Example 1,

Polymer 1

Poly (4,8-diaxa-3,7-dioxo-9-ethoxydecyl methacrylate)-co-3-(5-bicyclo-[2,2,1]heptene-2-yl)-1,1,1=trifluoro-2-(trifluorometyl)-2-propanol) methacrylate)-co-(dodecyl methacrylate)

(9EDMA/NBHFAMA/DDMA)

0.87 g (0.0053 mole) of 2,2'-azobisisobutyronitrile (AIBN) was added to a solution of 4.60 g (0.02 mole) of 2-carboxyethylmethacrylate-2-carboxyethylester, 2.37 g (0.0066 mole) of norbornylhexafluoroalcohol methacrylate, 4.80 g (0.02 mole) of dodecyl methacrylate and 0.53 g (0.0026 mole) of dodecanethiol in 30 g of methyl ethyl ketone. The solution was deoxygenated by bubbling dry $N_2$ gas through the solution for 0.5 hr and then the solution was allowed to reflux for 12 hr. The reaction mixture was cooled to room temperature and precipitated in 350 ml of distilled $H_2O$ with rigorous stirring. The resulting white waxy material (polymer A) was collected by filtration, washed with several portions of distilled $H_2O$, and dried under vacuum at 60° C. for 48 hr.

Subsequently, 0.067 g of triflouroacetic acid and 10.0 g ethyl vinyl ether (EVE) was added to a stirring solution of 1.5 g of polymer A in 13.5 g of PGMEA. The solution was stirred at room temperature for 3 hr before quenched with 2.0 g basic $Al_2O_3$. The mixture was stirred 2 hr and filtered though 1 micron filter.

Synthesis Example 2,

Polymer 2

Poly (4,8-diaxa-3,7-dioxo-9-ethoxydecyl methacrylate)-co-(3-(5-bicyclo-[2,2,1]heptene-2-yl)-1,1,1-trifluoro-2-(trifluorometyl)-2-propanol)methacrylate)-co-(2-oxo-3-oxatricyclo[4.2.1.04,8]nonan-5-yl methacrylate (9EDMA/NBHFAMA/NLMMA)

0.87 g (0.0053 mole) of 2,2'-azobisisobutyronitrile (AIBN) was added to a solution of 4.60 g (0.0200 mole) of 2-carboxyethylmethacrylate-2-carboxyethylester, 3.94 g (0.0177 mole) of norbornane lactone methacrylate (NLM), 2.37 g (0.0066 mole) of norbornylhexafluoroalcohol methacrylate, in 30 g of methyl ethyl ketone. The solution was deoxygenated by bubbling dry $N_2$ gas through the solution for 0.5 hr and then the solution was allowed to reflux for 12 hr. The reaction mixture was cooled to room temperature and precipitated in 350 ml of distilled $H_2O$ with rigorous stirring. The resulting white waxy material (polymer B) was collected by filtration, washed with several portions of distilled $H_2O$, and dried under vacuum at 60° C. for 48 hr.

Subsequently, 0.067 g of triflouroacetic acid and 10.0 g ethyl vinyl ether (EVE) was added to a stirring solution of 1.5 g of polymer B in 13.5 g of PGMEA. The solution was stirred at room temperature for 3 hr before quenched with 2.0 g basic $Al_2O_3$. The mixture was stirred 2 hr and filtered though 1 micron filter.

Synthesis Example 3

Polymer 3

Poly (4,8-diaxa-3,7-dioxo-9-ethoxydecyl methacrylate)-co-(isopropylhexafluoroalcohol)methacrylate-co-(2-oxo-3-oxatricyclo[4.2.1.04,8]nonan-5-yl methacrylate)

(9EDMA/iPrHFAMA/NLMMA)

0.87 g (0.0053 mole) of 2,2'-azobisisobutyronitrile (AIBN) was added to a solution of 4.60 g (0.0200 mole) of 2-carboxyethylmethacrylate-2-carboxyethylester, 3.94 g (0.0177 mole) of norbornane lactone methacrylate (NLM), 1.64 g (0.0066 mole) of isopropylhexafluoroalcohol methacrylate in 30 g of methyl ethyl ketone. The solution was deoxygenated by bubbling dry N2 gas through the solution for 0.5 hr and then the solution was allowed to reflux for 12 hr. The reaction mixture was cooled to room temperature and precipitated in 350 ml of distilled $H_2O$ with rigorous stirring. The resulting white waxy material (polymer C) was collected by filtration, washed with several portions of distilled $H_2O$, and dried under vacuum at 60° C. for 48 hr.

Subsequently, 0.067 g of triflouroacetic acid and 10.0 g ethyl vinyl ether (EVE) was added to a stirring solution of 1.5 g of polymer C in 13.5 g of PGMEA. The solution was stirred at room temperature for 3 hr before quenched with 2.0 g basic $Al_2O_3$. The mixture was stirred 2 hr and filtered though 1 micron filter.

Preparation of Photoresist Formulation 1

0.044 g of 20% solution of triphenylsulfonium nonafluorobutanesulfonate in PGMEA and 0.14 g of 0.5% solution of BockBim in PGMEA were added to 4.40 g of Polymer 2 solution and diluted with 5.40 g PGMEA. The mixture was stirred for 2 hr before being filtered with 0.2 micron filter.

Figure 4A:
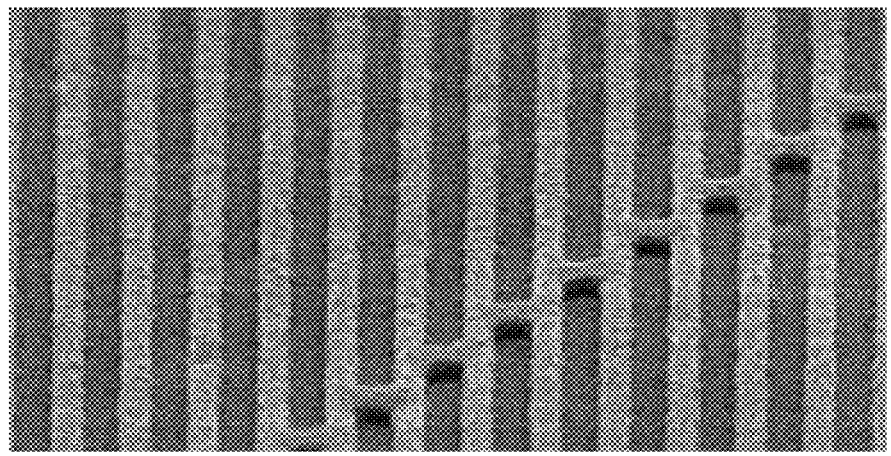
FIGS. 4A and 4B are SEM photomicrographs of a sub-quarter micron photoresist image composition based on (2-oxo-3oxatricyclo[4.2.1.04,8]nonan-5-yl methacrylate)/(3-(5-bicyclo-[2,2,1]heptene-2-yl)-1,1,1=trifluoro-2-(trifluoromethyl)-2-propanol)methacrylate)/ (2-oxo-3oxatricyclo[4.2.1.04,8]nonan-5-yl methacrylate) (9EDMA/NBHFAMA/NLMMA) polymer pre-exposed baked at about 60° C. and exposed at a dose of about 8.5 mj.
Figure 4B:
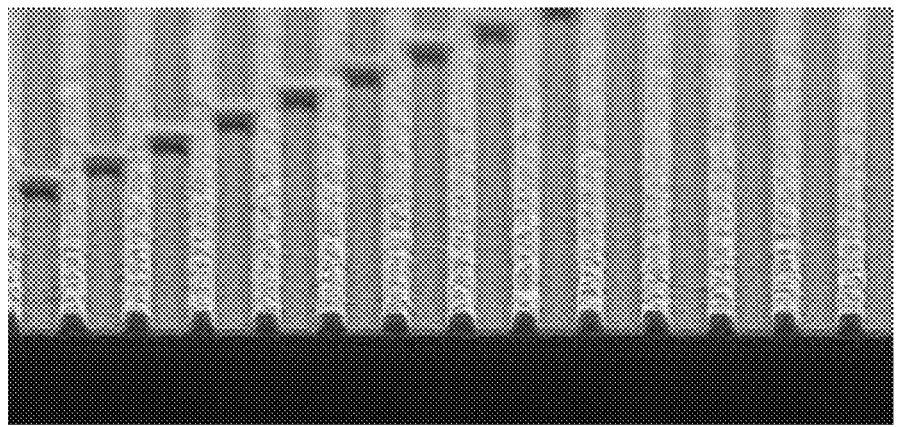

FIGS. 4A and 4B are SEM photomicrographs of a sub-quarter micron photoresist image composition based on poly (2-oxo-3oxatricyclo[4.2.1.04,8]nonan-5-yl methacrylate)-co-(3-(5-bicyclo-[2,2,1]heptene-2-yl)-1,1,1=trifluoro-2-(trifluorometyl)-2-propanol)methacrylate)-co-(2-oxo-3oxatricyclo[4.2.1.04,8]nonan-5-yl methacrylate) (9EDMA/NBHFAMA/NLMMA) polymer pre-exposed baked at about 60° C. and exposed at a dose of about 10.5 mj. In FIGS. 4A, and 4B, well defined photoresist lines and spaces with little to no loss of photoresist thickness is evident.

Figure 5A:
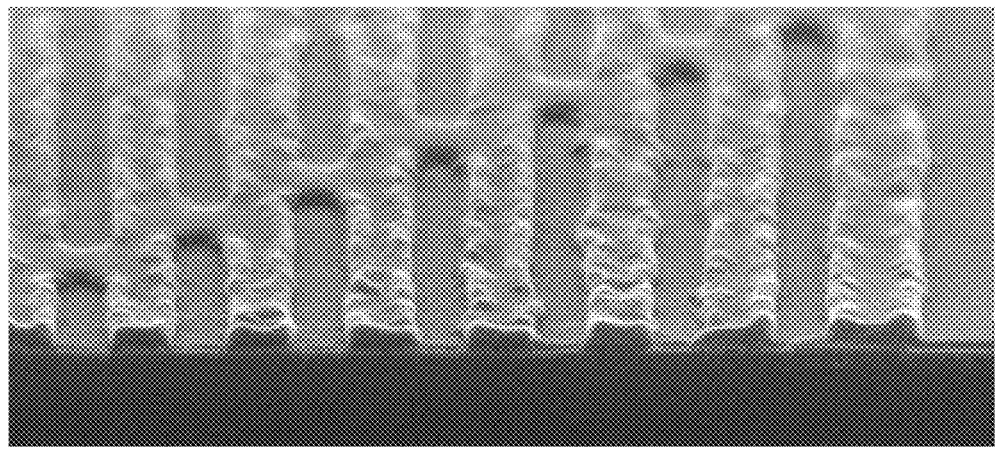
FIGS. 5A and 5B are SEM photomicrographs of a sub-quarter micron photoresist image composition based on (2-oxo-3oxatricyclo[4.2.1.04,8]nonan-5-yl methacrylate)/(3-(5-bicyclo-[2,2,1]heptene-2-yl)-1,1,1=trifluoro-2-(trifluoromethyl)-2-propanol)methacrylate)/(2-oxo-3oxatricyclo[4.2.1.04,8]nonan-5-yl methacrylate) (9EDMA/NBHFAMA/NLMMA) polymer pre-exposed baked at about 20° C. and exposed at a dose of about 8.5 mj.
Figure 5B:
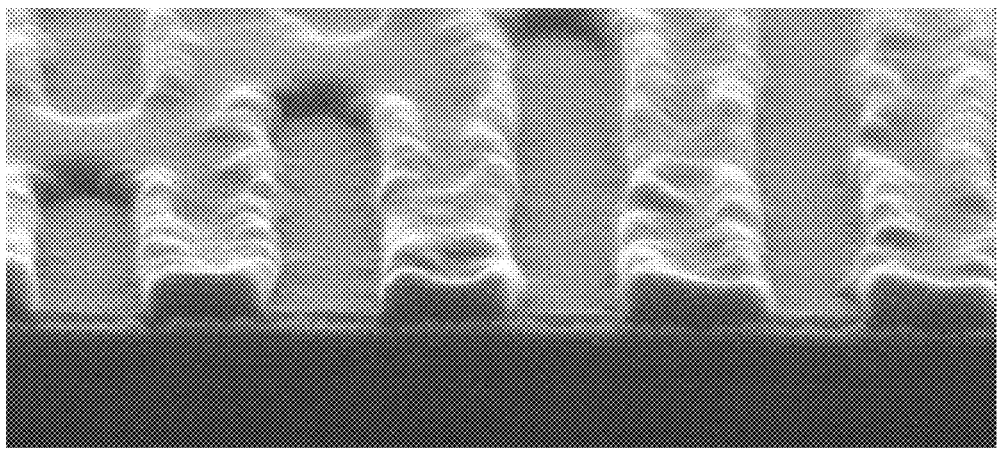

FIGS. 5A and 5B are SEM photomicrographs of a sub-quarter micron photoresist image composition based on poly (2-oxo-3oxatricyclo[4.2.1.04,8]nonan-5-yl methacrylate)-co-(3-(5-bicyclo-[2,2,1]heptene-2-yl)-1,1,1=trifluoro-2-(trifluorometyl)-2-propanol)methacrylate)-co-(2-oxo-3oxatricyclo[4.2.1.04,8]nonan-5-yl methacrylate) 9EDMA/NBHFAMA/NLMMA) polymer pre-exposed baked at about 20° C. and exposed at a dose of about 8.5 mj. In FIGS. 5A and 5B, both a lower exposure dose and PEB temperature were used to try to obtain the imaging limit of the photoresist composition. In FIGS. 5A, and 5B, less well-defined photoresist lines and spaces with some loss of photoresist thickness is evident.

Thus the embodiments of the present new photoresist materials and compositions with improved resolution in the sub quarter micron regime.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention.

What is claimed is:

1. A polymer, comprising:

a first monomer of the structure

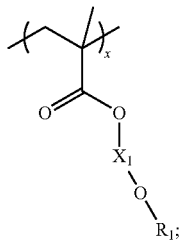

a second monomer of the structure

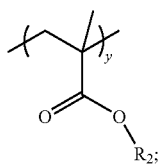

a third monomer of the structure

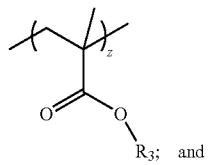

wherein $X_1$ is an alkyl ester group, or an alkyl ester chain, $R_1$ is an acetal group, $R_2$ includes a fluorinated alkyl group and $R_3$ is an alkyl group, cyclic group, hereto cyclic group, bicyclic group or hetero bicyclic group and wherein x+y+z is equal to about 100 mole %.

2. The polymer of claim 1, wherein, $X_1$, $R_1$ and $R_3$ do not contain fluorine atoms.

3. The polymer of claim 1, wherein $X_1$ is selected from the group consisting of —$CH_2CH_2CO$— and —$CH_2CH_2COOCH_2CH_2CO$—

4. The polymer of claim 1, wherein $R_1$ is selected from the group consisting of

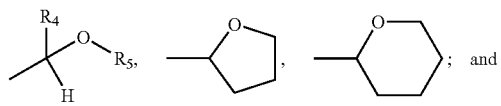

wherein $R_4$ and $R_5$ are independently selected from the group consisting of hydrogen, methyl, ethyl, n-propyl, isopropyl, n-butyl, isobutyl and t-butyl groups and saturated cyclic ethers.

5. The polymer of claim 1, wherein $R_2$ is selected from the group consisting of linear alkyl fluoroalcohols, branched alkyl fluoroalcohols, cycloalkanes having pendent alkyl fluoroalcohol groups and bicycloalkanes having pendent alkyl fluoroalcohol groups.

6. The polymer of claim 1, wherein $R_3$ is selected from the group consisting of straight and branched chain alkyl groups and bicycloalkyl and hetero-bicycloalkyl groups.

7. The polymer of claim 1, wherein said first monomer is selected from the group consisting of

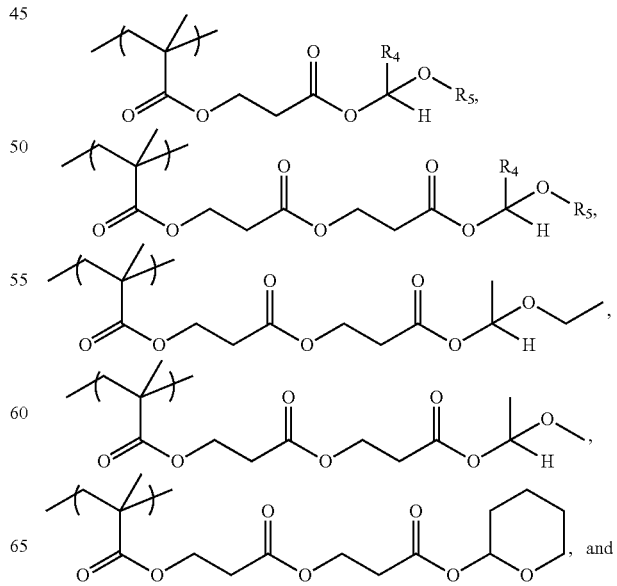

-continued

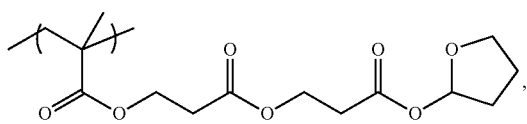, 5 wherein $R_4$ and $R_5$ are independently selected from the group consisting of hydrogen, methyl, ethyl, n-propyl, isopropyl, n-butyl, isobutyl and t-butyl groups and saturated cyclic ethers.

8. The polymer of claim 1, wherein said second monomer is selected from the group consisting of:

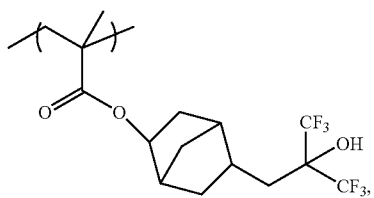

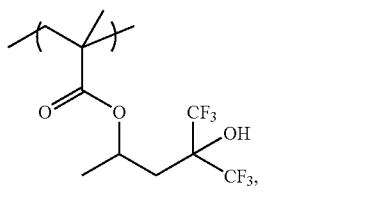

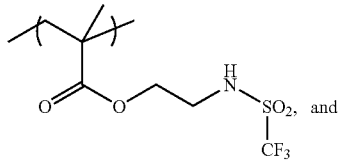 and

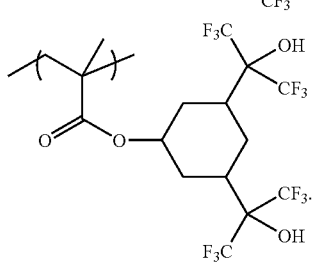

9. The polymer of claim 1, wherein said third monomer is selected from the group consisting of:

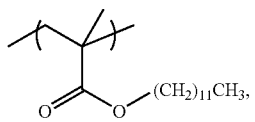

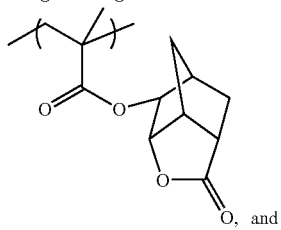 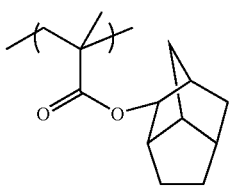

10. A photoresist formulation comprising:
a casting solvent;
a photoacid generator; and
a polymer comprising:
a first monomer of the structure

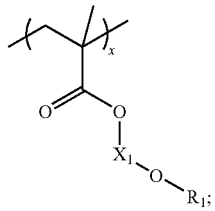

a second monomer of the structure

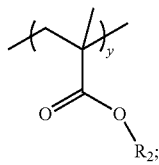

a third monomer of the structure

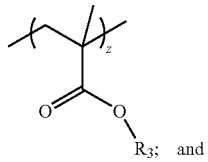

wherein $X_1$ is an alkyl ester group or an alkyl ester chain, $R_1$ is an acetal group, $R_2$ includes a fluorinated alkyl group and $R_3$ is an alkyl group, cyclic group, hetero cyclic group, bicyclic group or hetero bicyclic group and wherein x+y+z is equal to about 100 mole %.

11. The photoresist formulation of claim 10, wherein, $X_1$, $R_1$ and $R_3$ do not contain fluorine atoms.

12. The photoresist formulation of claim 10, wherein $R_1$ is selected from the group consisting of

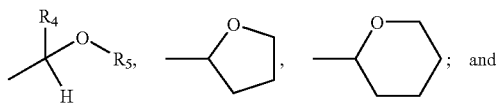; and wherein $X_1$ is selected from the group consisting of —CH$_2$CH$_2$CO— and —CH$_2$CH$_2$COOCH$_2$CH$_2$CO—
wherein $R_2$ is selected from the group consisting of linear alkyl fluoroalcohols, branched alkyl fluoroalcohols, cycloalkanes having pendent alkyl fluoroalcohol groups and bicycloalkanes having pendent alkyl fluoroalcohol groups;
wherein $R_3$ is selected from the group consisting of straight and branched chain alkyl groups and bicycloalkyl and hetero-bicycloalkyl groups; and
wherein $R_4$ and $R_5$ are independently selected from the group consisting of hydrogen, methyl, ethyl, n-propyl, isopropyl, n-butyl, isobutyl and t-butyl groups and saturated cyclic ethers.

13. The photoresist formulation of claim 10, wherein said first monomer is selected from the group consisting of:

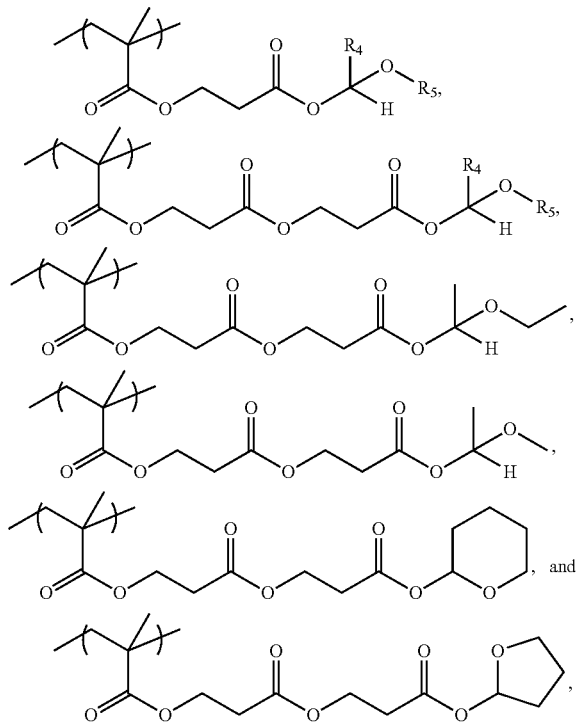

wherein $R_4$ and $R_5$ are independently selected from the group consisting of hydrogen, methyl, ethyl, n-propyl, isopropyl, n-butyl, isobutyl and t-butyl groups and saturated cyclic ethers.

14. The photoresist formulation of claim 10, wherein said second monomer is selected from the group consisting of:

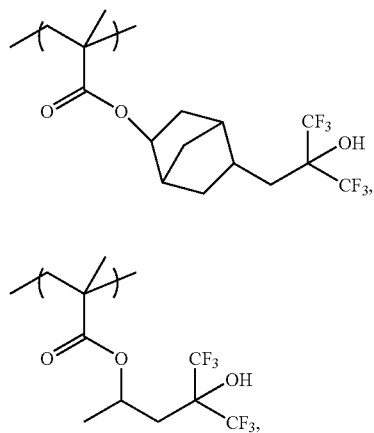

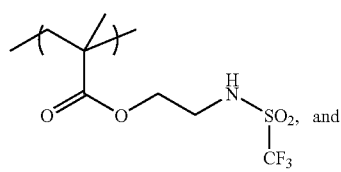

-continued

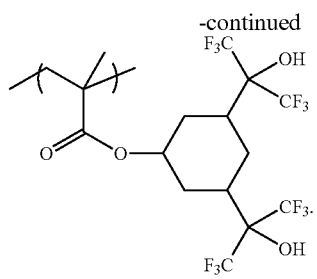

15. The photoresist formulation of claim 10, wherein said third monomer is selected from the group consisting of:

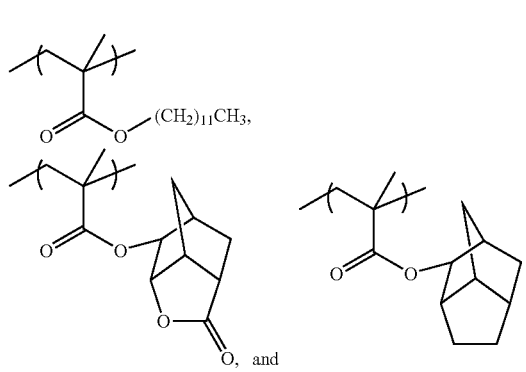

16. A method, comprising:
(a) forming a layer of a photoresist formulation on a substrate, said photoresist formulation comprising:
  a casting solvent;
  a photoacid generator; and
  a polymer comprising:
    a first monomer of the structure

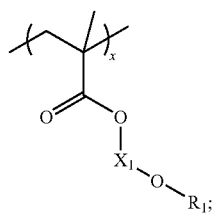

a second monomer of the structure

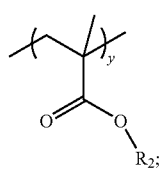

a third monomer of the structure

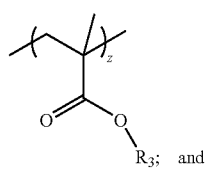

wherein $X_1$ is an alkyl ester group or an alkyl ester chain, $R_1$ is an acetal group, $R_2$ includes a fluorinated alkyl group and $R_3$ is an alkyl group, cyclic group, hereto cyclic group, bicyclic group or hetero bicyclic group and wherein x+y+z is equal to about 100 mole %;
(b) performing a post apply bake at a temperature greater than room temperature to drive out said casting solvent from said layer of photoresist composition to form a photoresist film;
(c) patternwise exposing said photoresist film to actinic radiation to form an exposed photoresist film;
after (c), (d) performing a post exposure bake at a temperature of about 60° C. or less; and
after (d), (e) developing said exposed photoresist film in an aqueous alkaline solution to remove regions of said exposed photoresist film that were exposed to said actinic radiation.

17. The method of claim 16, wherein, $X_1$, $R_1$ and $R_3$ do not contain fluorine atoms.

18. The method of claim 16, wherein $R_1$ is selected from the group consisting of

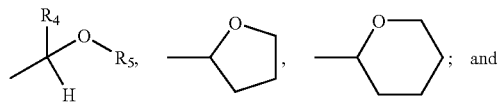

wherein $X_1$ is selected from the group consisting of
—CH$_2$CH$_2$CO— —CH$_2$CH$_2$COOCH$_2$CH$_2$CO—

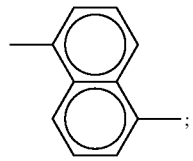

wherein $R_2$ is selected from the group consisting of linear alkyl fluoroalcohols, branched alkyl fluoroalcohols, cycloalkanes having pendent alkyl fluoroalcohol groups and bicycloalkanes having pendent alkyl fluoroalcohol groups;
wherein $R_3$ is selected from the group consisting of straight and branched chain alkyl groups and bicycloalkyl and hetero-bicycloalkyl groups; and
wherein $R_4$ and $R_5$ are independently selected from the group consisting of hydrogen, methyl, ethyl, n-propyl, isopropyl, n-butyl, isobutyl and t-butyl groups and saturated cyclic ethers.

19. The method of claim 16, wherein said first monomer is selected from the group consisting of:

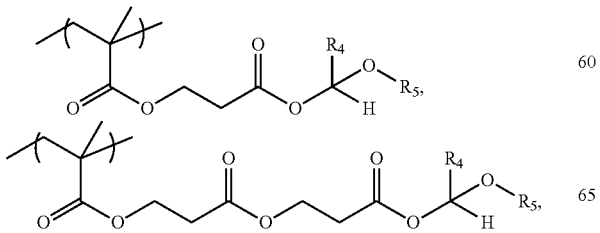

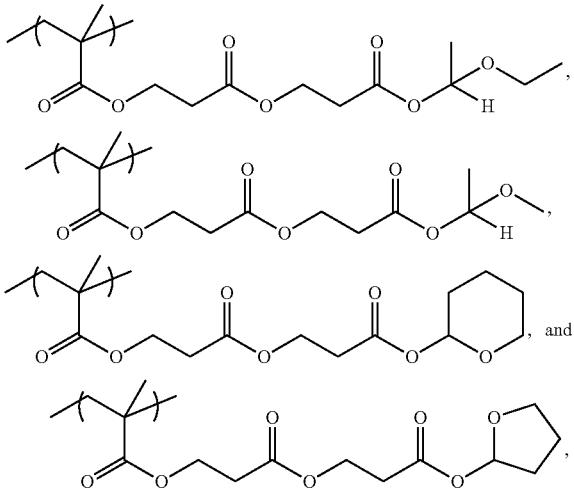

wherein $R_4$ and $R_5$ are independently selected from the group consisting of hydrogen, methyl, ethyl, n-propyl, isopropyl, n-butyl, isobutyl and t-butyl groups and saturated cyclic ethers.

20. The method of claim 16, wherein said second monomer is selected from the group consisting of:

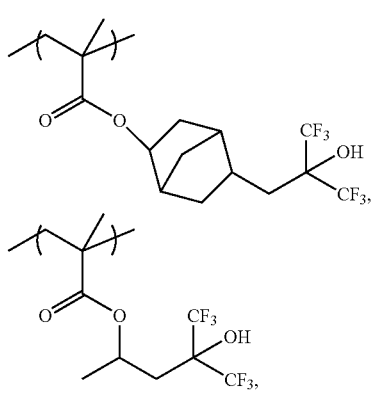

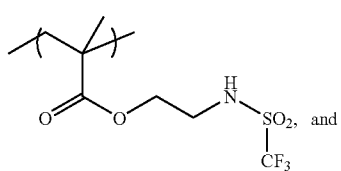

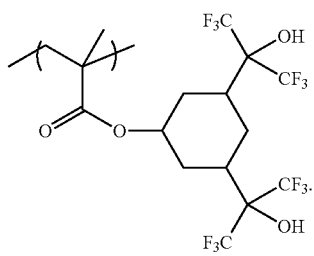

21. The method of claim 16, wherein said third monomer is selected from the group consisting of:

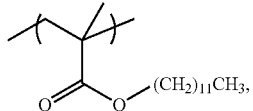

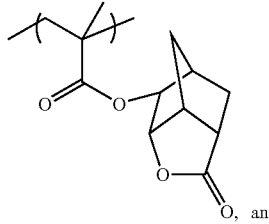 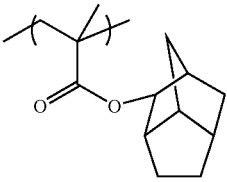

22. The method of claim 16, wherein said polymer consists essentially of the monomers

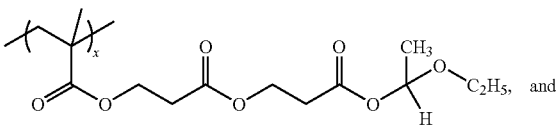

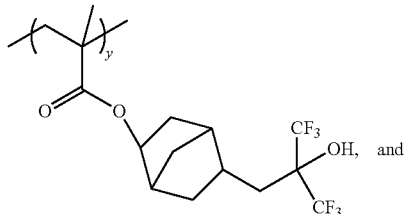

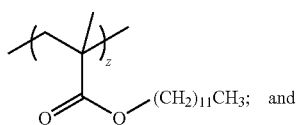

wherein x:y:z=30-50 mole %: 10-30 mole %: 30-50 mole % and x+y+z does not exceed 100 mole %.

23. The method of claim 16, wherein said polymer consists essentially of the monomers

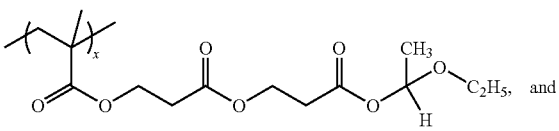

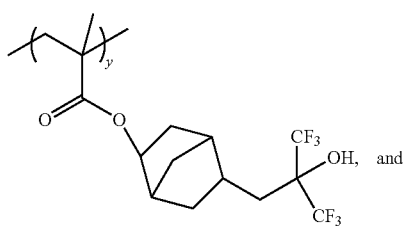

-continued

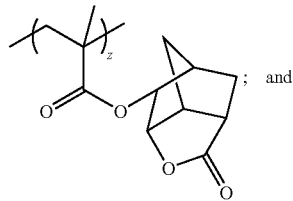

wherein x:y:z=35-55 mole %: 5-25 mole %: 30-50 mole %.and x+y+z does not exceed 100 mole %

24. The method of claim 16, wherein said polymer consists essentially of the monomers

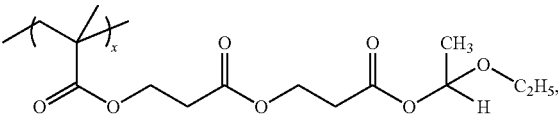

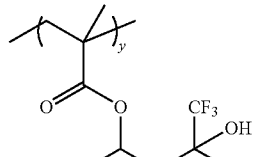

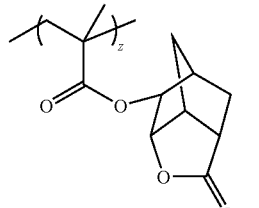

wherein x:y:z=35-55 mole %: 5-25 mole %: 30-50 mole % and x+y+z does not exceed 100 mole %.

25. The method of claim 16, wherein said post exposure bake is performed at a temperature of less than 60° C.

26. The method of claim 16, further including:

(i) forming a bottom antireflective coating on said substrate before forming said layer of said photoresist formation or (ii) forming a top antireflective coating on said layer of said photoresist formation of (iii) forming a bottom antireflective coating on said substrate before said forming said layer of said photoresist formation and forming a top antireflective coating on said layer of said photoresist formation

27. The polymer of claim 1, wherein said polymer consists essentially of the monomers

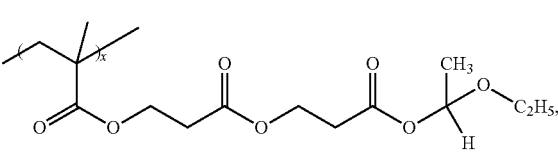

and

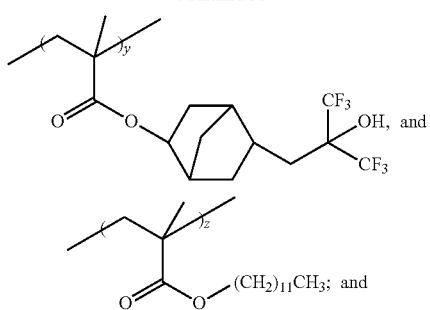

wherein x:y:z=30-50 mole %: 10-30 mole %: 30-50 mole % and x+y+z does not exceed 100 mole %.

28. The polymer of claim 1, wherein said polymer consists essentially of the monomers

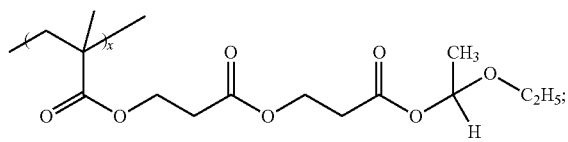

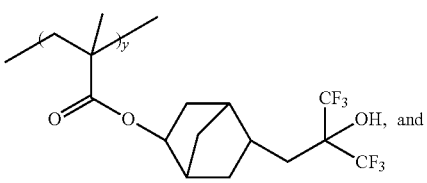

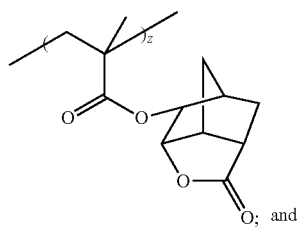

wherein x:y:z=35-55 mole %: 5-25 mole %: 30-50 mole % and x+y+z does not exceed 100 mole %.

29. The polymer of claim 1, wherein said polymer consists essentially of the monomers

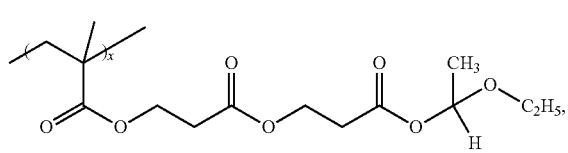

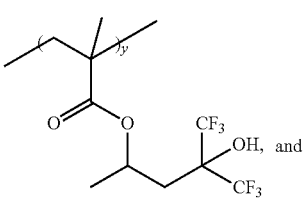

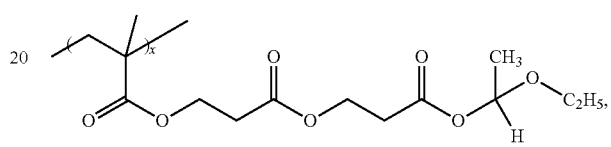

wherein x:y:z=35-55 mole %: 5-25 mole %: 30-50 mole % and x+y+z does not exceed 100 mole %.

30. The polymer of claim 1 photoresist formulation of claim 10, wherein said polymer consists essentially of the monomers

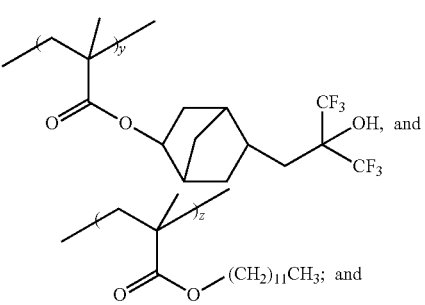

wherein x:y:z=30-50 mole %: 10-30 mole %: 30-50 mole % and x+y+z does not exceed 100 mole %.

31. The polymer of claim 1 photoresist formulation of claim 10, wherein said polymer consists essentially of the monomers

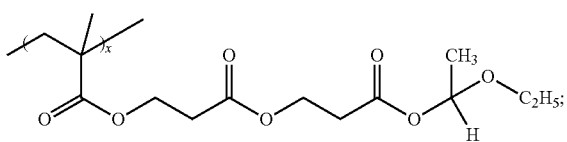

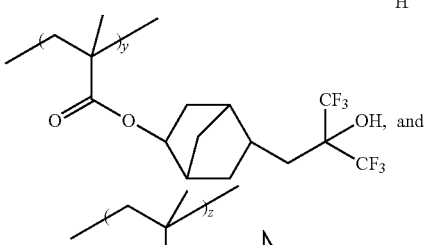

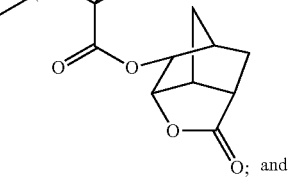

wherein x:y:z=35-55 mole %: 5-25 mole %: 30-50 mole % and x+y+z does not exceed 100 mole %.

32. The polymer of claim 1 photoresist formulation of claim 10, wherein said polymer consists essentially of the monomers
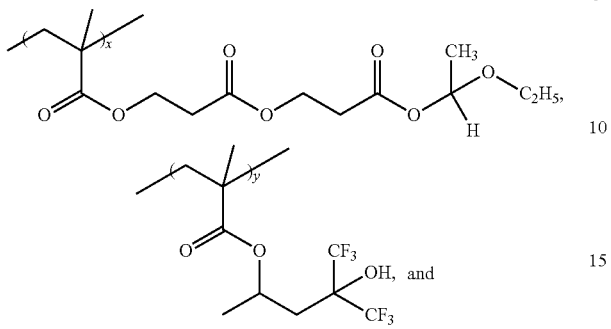
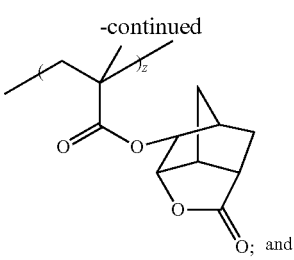
wherein x:y:z=35-55 mole %: 5-25 mole %: 30-50 mole % and x+y+z does not exceed 100 mole %.
* * * * *